United States Patent [19]

Berg et al.

[11] Patent Number: 4,802,589
[45] Date of Patent: Feb. 7, 1989

[54] HOUSING FOR ELECTROTECHNICAL EQUIPMENT

[75] Inventors: Franco Berg, Isernhagen; Claus-Dieter Bovermann, Breidenbach-Niederdieten, both of Fed. Rep. of Germany

[73] Assignee: Rittal-Werk Rudolf Loh GmbH & Co. KG, Fed. Rep. of Germany

[21] Appl. No.: 102,035

[22] Filed: Sep. 29, 1987

[30] Foreign Application Priority Data

Sep. 30, 1986 [DE] Fed. Rep. of Germany ....... 3633248

[51] Int. Cl.$^4$ ............................................. B65D 85/62
[52] U.S. Cl. .................................. 206/511; 206/509; 220/40
[58] Field of Search ............... 206/507, 511, 512, 506, 206/509; 220/3.2, 4 D

[56] References Cited

U.S. PATENT DOCUMENTS

| | | | |
|---|---|---|---|
| 2,198,106 | 4/1940 | Chandonia | 206/511 |
| 2,998,156 | 8/1961 | Stricker, Jr. | 206/509 |
| 3,521,764 | 7/1970 | Loomis | 206/512 |
| 3,980,185 | 9/1976 | Cain | 206/509 |
| 4,186,841 | 2/1980 | Buckley et al. | 206/511 |
| 4,423,813 | 1/1984 | Kreeger et al. | 206/507 |

FOREIGN PATENT DOCUMENTS 1442498 5/1966 France ........................... 206/509

Primary Examiner—David T. Fidei
Attorney, Agent, or Firm—Thomas W. Speckman; Ann W. Speckman

[57] ABSTRACT

Housing for electrotechnical equipment comprising two side walls, a top wall and a bottom wall which form a box-like framework with two openings which are sealable by means of a back wall, door, or inspection window, whereby in at least corner areas of the top and bottom walls support legs are pivotally mounted which are adjustable from a retracted position in which they are flush with the housing walls to an extended position in which they are perpendicular to the top wall and the bottom wall. Stacking of a plurality of housings such that they are prevented from shifting is attained in a simple manner in that at least the legs of the bottom wall are designed as stacking legs, and at least the legs on the top wall when they are in the retracted position form stacking seats for retaining the terminal ends of stacking legs of the adjacent housing which have been adjusted to the extended position.

19 Claims, 3 Drawing Sheets

HOUSING FOR ELECTROTECHNICAL EQUIPMENT

BACKGROUND OF THE INVENTION

1. Field of the Invention

This invention relates to a housing for electrotechnical equipment comprising two side walls, a top wall and a bottom wall which form a box-like framework having two openings which are sealable by means of a back wall, door, or inspection window, and wherein at least the corner areas of the top and bottom walls are provided with pivotally mounted support legs which are adjustable from a retracted position in which they are flush with the housing to an extended position in which they are generally perpendicular to the plane of the top wall or the bottom wall.

2. Description of the Prior Art

A housing of this general type is taught by German Registered Utility Model No. 85 11 254. In this prior art housing, the support legs are designed as flaps which serve as support legs on the bottom of the housing, while on the top wall, they serve only to cover fastening screws which attach the top wall to the side walls of the housing. Additionally, the pivot axes of the flaps are oriented generally perpendicular to the side walls of the housing.

If several of the prior art types of housings are stacked on top of one another, they are not stabilized against shifting. There is the risk that if a stack in which they are arranged one on top of another in this manner is accidentally bumped, the uppermost housing may be displaced and fall. In addition, the stability of the prior art housing with four support legs provided on the bottom wall with the prescribed orientation of the pivot axes is not particularly good unless the support legs are lockable in the extended position. However, locking mechanisms require a considerable outlay.

As is taught in German Registered Utility Model No. 80 25 774, orienting the pivot axes of the support legs parallel to the side walls of the housing is also known.

SUMMARY OF THE INVENTION

It is an objective of the present invention to provide a housing for electrotechnical equipment of the type described above which is stackable with housings of the same type, whereby multiple, stacked housings are secured against lateral shifting in a simple manner.

This objective is achieved according to the present invention in that at least the support legs provided on the bottom wall of the housing are designed as stacking legs, and at least support legs provided on the top wall have stacking seats when they are in the retracted position for retaining the stacking legs on adjacent housings when the stacking legs are in the extended position.

Only by means of the present design of the support legs, can this type of interlocking connection between housings stacked one on top of another be attained. The positioning of housings in a stack of housings such that they are secured against lateral shifting is achieved by the engagement of the extended stacking legs of an upper housing in stacking seats of stacking legs in the retracted position in a lower housing.

The structure of the housing itself plays no role in this. The design may be such that side walls, top wall and bottom wall form a one-piece framework, or the side walls may be separate from and fastenable to the top wall and bottom wall, with the stacking legs covering the fastening screws.

To prevent the stacking legs from having too great an impact on the configuration of the housing, one embodiment provides that the stacking legs are pivotally mounted in recesses in the housing in the vicinity of the edges where the side walls join the top wall and the bottom wall.

When the stacking legs are mounted with pivot axes which are oriented parallel to these edges, the stability of an individual stacked housing is improved without the necessity of providing a locking mechanism to retain the stacking legs in the extended position, because when components are being inserted into the housing, no force which would displace the stacking legs to the retracted position may be exerted on the extended stacking legs.

According to another embodiment, additional stacking seats may be uniformly distributed between two stacking legs provided at the corners, and spaced at intervals (b) corresponding to the length of the stacking legs in the longitudinal direction plus the distance between adjacent stacking seats. Similar housings with shorter structural depths may then also be included in the stack. It is preferably provided that stacking legs are arranged at an interval (a) from the opening of the housing which corresponds to the intervals between adjacent stacking seats.

A definite positive locking of terminal ends of the stacking legs in the stacking seats is achieved according to one embodiment wherein the stacking seats are formed along the edges of the housing as grooves originating at the edges in the retracted position, and the groove bases, which are at an angle of about 135° to the outer surfaces of the adjacent side wall and the adjacent top wall or the adjacent bottom wall and which make the transition to the stacking seats by means of a perpendicular ledge, and that the end of the extended stacking leg has a contour corresponding to the contour of the groove base with its transitional sections.

Mounting of the stacking legs on the housing is facilitated in that each stacking leg is pivotally mounted in a base member which is mounted in a recess of the housing. The stacking leg may thus be manufactured separately as a unit together with the base member and then may simply be screw fastened into the recess in the housing. Where applicable, the top wall or bottom wall may be attached to the side walls with fastening screws.

One embodiment for pivotally mounting the stacking legs is characterized in that the base member is essentially U-shaped and has a base plate and two side arms; the base plate at one edge of the base member adjoins a bearing seat for a bearing block of the stacking leg; side arms of the base element are provided with bores for a bearing shaft in the vicinity of the bearing seat, and the bearing shaft is mounted in the bore of the bearing block of the stacking leg; and the base plate of the stacking leg, when in its retracted position, covers the side arms of the base member.

A defined extended position for the stacking legs may be simply provided when the bearing seat of the base member is provided with stops, against which counterstops of the bearing block of a stacking leg which is in the extended position come to rest. The stacking leg in its extended position is preferably perpendicular to the outer surface of the top wall or the bottom wall. According to one embodiment, the stacking leg is U-shaped and comprises a support plate and two side arms which extend from the bearing block; the outside of the base plate is flush with the outside of the top wall or the bottom wall and the side arms abut the base plate of the base member in the retracted position; the surfaces of the support plate and the side arms which face away from the bearing block form the end of the stacking leg; and the surface of the support plate which faces toward the bearing block and serves as a counterstop, in combination with the stop on the bearing seat of the base element which is exposed when the stacking leg is retracted, form a stacking seat.

If a tilted orientation of the housing is also desired, a further embodiment provides that along with the stacking leg, and on the same pivot axis, a support leg is pivotally mounted, the support leg being longer than the stacking leg and adjustable from a flush retracted position to an extended position in which it is at an angle of greater than 90° with respect to the outer surface of the top wall or the bottom wall.

Pivotable mounting of the support leg and stacking leg in the base member may be provided in that the support leg is mounted on the bearing shaft with its two side arms between the side arms of the base member and the side arms of the stacking leg; the side arms of the support leg in its retracted position abut the base plate of the base member and are connected in the region outside the support plate of the stacking leg by means of a connecting plate; the support plate of the stacking leg covers the side arms of the support leg and the side arms of the base member; the connecting plate of the support leg covers the side arms of the base member; and the front edges of the side arms of the stacking leg which face the support plate of the stacking leg in the retracted positions of stacking leg and support leg are at an acute angle to the support plate of the stacking leg, which angle opens toward the terminal end of the stacking leg and support leg.

If the top and bottom walls of the housing are precisely defined, then the cost can be further reduced. Stacking seats are only provided according to a prescribed distribution in the top wall of the housing and the bottom wall of the housing has four stacking units, each comprising a stacking leg and a support leg. The stacking legs and support legs are provided on the bottom wall and may be extended into stacking seats provided in the housing positioned below, the top wall of which has only the required stacking seats. By providing the same distribution of stacking seats, it is also possible to stack housings of varying depths.

If, on the other hand, the top wall of the housing is provided with four stacking units, each comprising a stacking leg, and stacking seats are arranged in that distribution, and the bottom wall of the housing is provided with four stacking units, each comprising a stacking leg or a stacking leg and a support leg, then the stacking legs on the top wall may be used to cover the fastening screws. If adjacent housings are arranged in a stack, the stacking legs may then be pivoted to an extended position from an upper or from a lower adjacent housing in the stack, and thus may be brought into mutual engagement.

BRIEF DESCRIPTION OF THE DRAWINGS

Preferred embodiments of the present invention will be described in greater detail below with reference to the drawings, in which.

DESCRIPTION OF PREFERRED EMBODIMENTS

Figure 1:
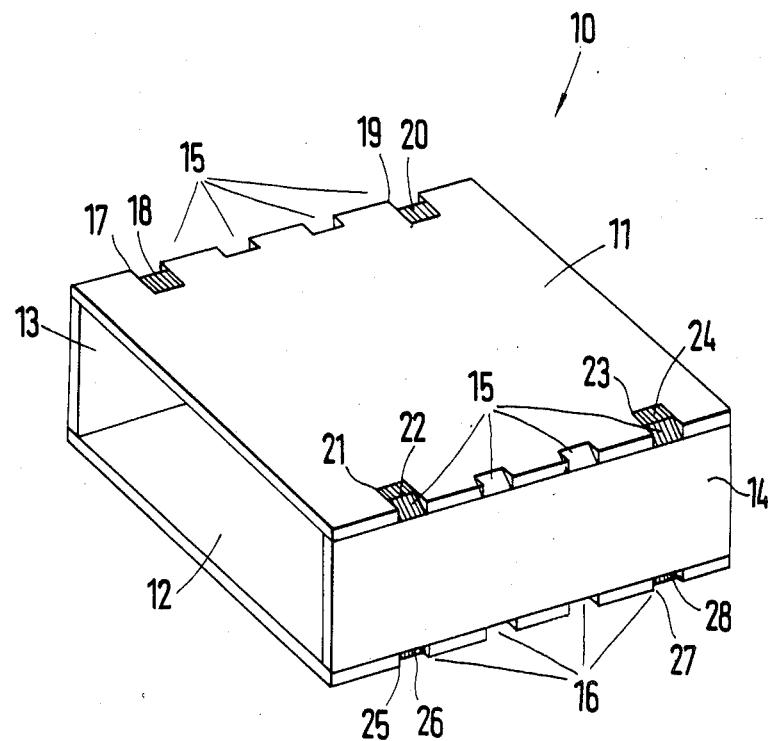
FIG. 1 shows a perspective view of a schematic representation of a housing with stacking legs and stacking seats.

Box-like housing 10 shown in FIG. 1 comprises top wall 11, bottom wall 12 and side walls 13 and 14. Although the walls are shown as separate components, they may also be joined to form a one-piece unit. Stacking seats 15 and 16 are provided in the area of intersecting walls of the box-like housing framework. Stacking seats 15 and 16, which project toward the interior of the housing framework, are provided by pivotable stacking legs 18, 20, 22, 24, 26, and 28 when the stacking legs are adjusted to the flush, retracted position. These stacking legs are retractable into recesses 17, 19, 21, 23, 25 and 27 of top wall 11 and bottom wall 12. The structural design of the stacking legs and their retraction into the recesses will be discussed in greater detail below.

Figure 2:
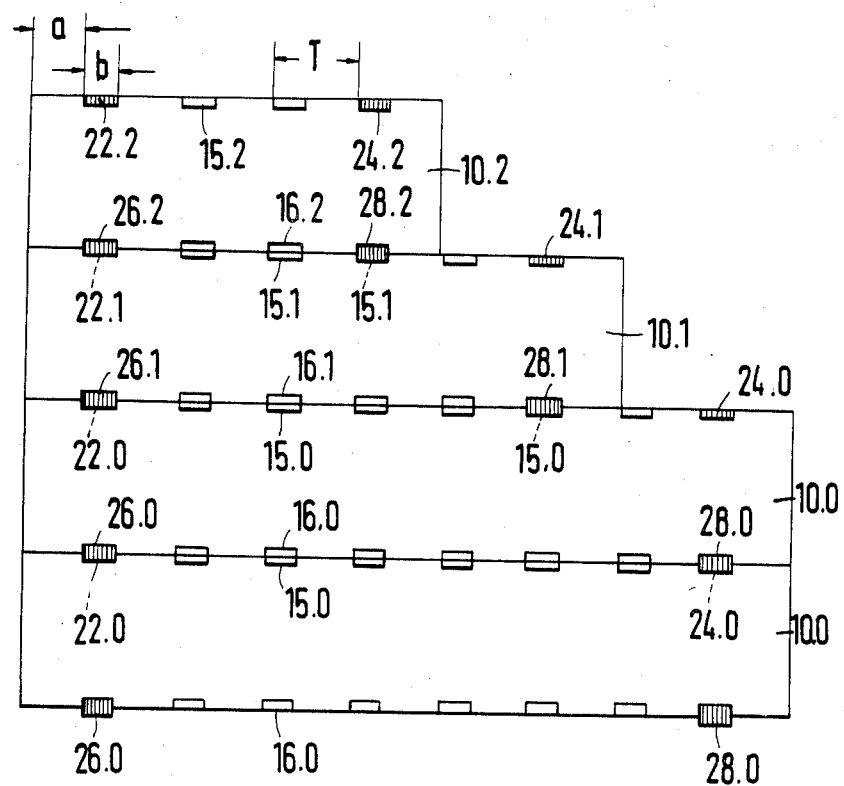
FIG. 2 shows a side view of a stack of a plurality of housings having varying depths.

As shown in FIG. 2, the stacking legs are preferably arranged at an interval (a) from the edge of the housing framework. Interval (a) also preferably corresponds to the interval between stacking seats 15 and 16. Width (b) of the stacking legs and the width of the stacking seats 15 and 16 are preferably equal, and thus a uniform interval (T) corresponding to the sum of interval (a) and width (b) is provided between the stacking legs and stacking seats. If the distribution and dimensions of stacking legs and stacking seats are constant in the case of a plurality of housings 10.0, 10.1 and 10.2, which have varying depths, then these housings are stackable on top of one another as shown in FIG. 2 so that they will not shift laterally. The lowermost housing 10.0 has six additional stacking seats 16.0 between extended stacking legs 26.0 and 28.0 on the bottom wall and six corresponding additional stacking seats 15.0 between retracted stacking legs 22.0 and 24.0 on the top wall. If a similar housing 10.0 is stacked on top of it, then the extended stacking legs 26.0 and 28.0 of the second housing 10.0 will rest in stacking seats 15.0 of the stacking legs 22.0 and 24.0 of the first housing 10.0.

Housing 10.1 has only four additional stacking seats 16.1 between stacking legs 26.1 and 28.1 at the bottom wall and four additional stacking seats 15.1 between stacking legs 22.1 and 24.1 at the top part. Extended stacking leg 26.1 of housing 10.1 is inserted into stacking seats 15.0 of retracted stacking leg 22.0 of housing 10.0, while tended stacking leg 28.1 of housing 10.1 is inserted into stacking seat 15.0 in housing 10.0. Finally, housing 10.2 has only two additional stacking seats 16.2 between stacking legs 26.2 and 28.2 at the bottom wall and only two additional stacking seats 15.2 between stacking legs 22.2 and 24.2. The extended stacking leg 26.2 of housing 10.2 is inserted into stacking seat 16.2 of retracted stacking leg 22.1 of housing 10.1, while extended stacking leg 28.2 of housing 10.2 is inserted into stacking seat 15.1 of housing 10.1.

FIG. 2 also shows the stacking leg on the bottom of one housing extended and inserted into the stacking seat of a retracted stacking leg on the top of an adjacent housing positioned below it. One would, however, also achieve the same result if, for example, stacking leg 26.2 remained retracted at the bottom wall of housing 10.2 and instead stacking leg 22.1 of housing 10.1 positioned below it were extended and inserted into stacking seat 16.2 of stacking leg 26.2.

If the top and bottom walls of the housing are both provided in the same way with stacking legs and stacking seats, then the housing may be used in two positions which are rotated by 180°. This has undeniable advantages with respect to the outlay. However, if the top and bottom walls of the housing are clearly defined, then it is sufficient to provide only the bottom wall of the housing with the stacking legs and stacking seats and to design only the top wall with stacking seats. According to this embodiment, stacking seats may then be omitted between the stacking legs at the bottom wall without sacrificing the ability to stack housings of various depths.

The design of stacking legs and stacking seats will be explained in more detail with reference to the embodiment shown in FIGS. 3 and 4. The stacking leg may be manufactured separately as a unit comprising U-shaped base housing 30 installed in a correspondingly shaped and dimensioned recess 17, 19, 21, 23, 25, or 27 of the housing. This arrangement is provided in the vicinity of the outer edges of the top and/or bottom wall and extends inwardly from the edges of the housing, as shown in FIG. 1. Base housing 30 comprises base plate 35 and two side arms 36. Bearing seat 31 is provided at one end of base housing 30, and is provided with two stops 32 and 34. In the vicinity of bearing seat 31, side arms 36 have bores 37 for bearing shaft 38, which may be inserted into bore 41 of bearing block 40 of the stacking leg. Base plate 35 has bores for fastening screws 39, which may serve not only for connecting base housing 30 to the stackable housing, but also for connecting top wall 11 or bottom wall 12 to side wall 13 or side wall 14.

Two side arms 44 of the stacking leg are mounted on bearing block 40 which are supported in the retracted position on base plate 35 of base housing 30. Support plate 42 connects the two side arms 44 of the stacking leg and in the retracted position is flush with the outside of top wall 11 or bottom wall 12. Support plate 42 with its face which is turned toward bearing block 40 forms counterstop 43, while bearing block 40 itself forms counterstop 46 for stops 32 and 34 of bearing seat 31. In this manner, it is assured that the extended stacking leg is vertical to the outside of top wall 11 or bottom wall 12 facing it, as reference number 42' of the support plate which is shown as a dashed line indicates. Thereby support plate 42 with counterstop 43 is supported on stop 32 of bearing seat 31 and counterstop 46 of bearing block 40 is supported on stop 34 of bearing seat.

Support plate 42 with its width covers side arm 36 of base housing 30, so that in the retracted position it completely closes the associated recess of the housing.

An additional support leg may also be supported next to the stacking leg on the same bearing shaft 38. This support leg has two side arms 48, which are supported on bearing shaft 38 at bore 49 between side arms 36 of base housing 30 and side arms 44 of the stacking leg. The support leg is longer than the stacking leg and the two side arms 48 are only connected with one another outside support plate 42 of the stacking leg by means of connecting plate 47. Side arms 48 of the support leg are supported in the retracted position on base plate 35 of base housing 30, whereby the outside of connecting plate 47 terminates flush with the outside of top wall 11 or bottom wall 12 and the outside of support plate 42 of the retracted stacking leg, as shown in FIG. 3. Connecting plate 47 thereby also covers side arms 36 of base housing 30, to completely cover the correspondingly enlarged recess in the housing.

Faces 52 of side arms 48 of the support legs which are turned toward support plate 42 of the stacking leg when the stacking leg and support leg are in the retracted position form, together with bottom 51 of support plate 42 of the stacking leg, an acute angle which opens toward the free ends of the stacking leg and support leg. This achieves the effect that when the support leg is extended, not only is the stacking leg necessarily extended with it, but also the stacking leg in the extended position provides a limit for the outward pivotal movement of the support leg. Thus faces 52 of side arms 48 of the support leg strike against bottom 51 of support plate 42 of the stacking leg, as is indicated with reference numbers 51', 52' in the positions of the stacking leg and support leg which are shown as a dashed line. The pivot angle of the stacking leg is 90°, while the support leg is extendable additionally by the acute angle formed by faces 52 of side arms 48 of the support leg and bottom 51 of support plate 42 of the stacking leg when these are in their retracted positions, and the housing may thus be arranged at a tilt.

In the universally applicable design, these types of units comprising a base housing, stacking leg and support leg are attached on the top and bottom of the housing, and stacking seats which are designed correspondingly are provided at uniform intervals. However, the simplified design, whereby only the bottom wall has such units while the top wall has only the stacking seats or units comprising a base housing and stacking leg, may also be utilized. In this case, the stacking legs serve only as stacking seats and cover flaps for necessary fastening screws.

Figure 3:
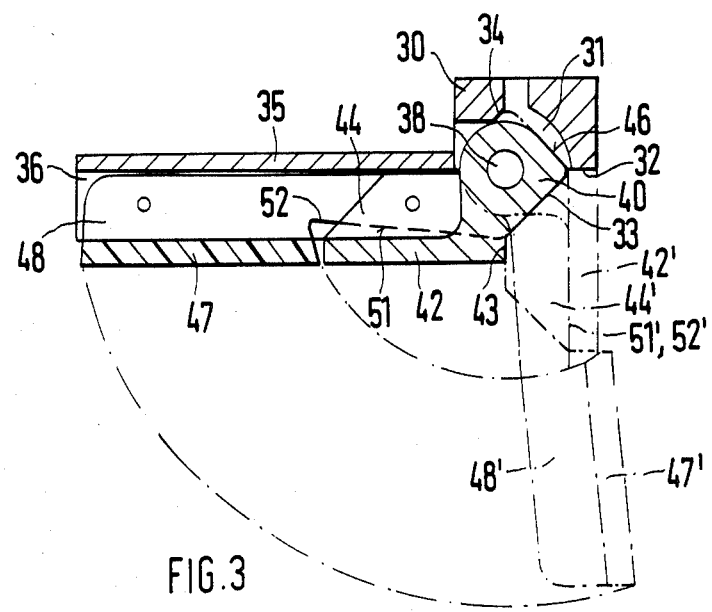
FIG. 3 shows a longitudinal cross-sectional view of a stacking unit comprising a base member with a stacking leg and a support leg.
Figure 4:
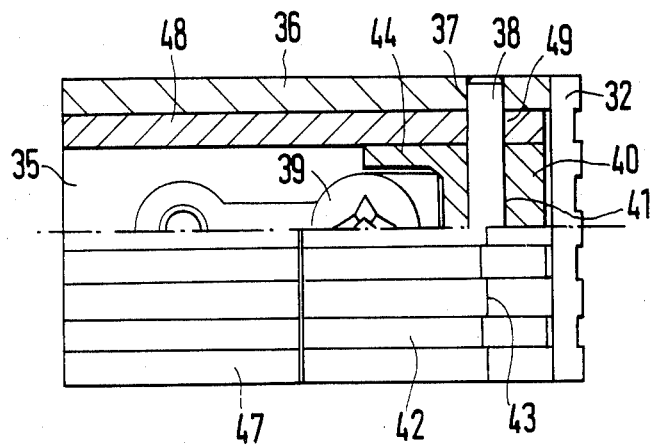
FIG. 4 shows a top view, partially in cross section, of the unit shown in FIG. 3.

The configuration of the stacking seats is also visible in FIG. 3. Stop 32 of bearing seat 31 and counterstop 43 of support plate 42 together with flat surface 33 of bearing block 40, which is inclined toward this at an angle of about 135°, form the boundaries of the stacking seat with a contour which corresponds to the contour of the face which is turned away from bearing block 40 of support plate 42 with the canted side arms 44 of the stacking leg and forms the stacking end of the stacking leg. Stacking seats 15 and 16 of the housing are provided in the form of grooves in the edges, whereby the groove base is at an angle of about 135° to the outsides of the adjacent side wall 13 or 14 and of top wall 11 or bottom wall 12, and merge into these via perpendicular shoulders. The perpendicular shoulders are thereby dimensioned in a manner which is determined by the thickness of support plate 42 of the stacking leg.

As mentioned previously, it is possible to provide stacking legs or stacking legs and support legs only on bottom wall 12 of the housing. Top wall 11 and bottom wall 12 of the housing are designed identically and are provided in the same way with recesses for the stacking legs or the stacking legs and support legs. However, recesses 17, 19, 21 and 23 of top wall 11 may be closed off by means of attachable cover plates which have stacking seats 15 in their edge regions.

We claim:

1. Housing for electrotechnical equipment comprising two side walls, a top wall and a bottom wall, said walls forming a framework having two generally rectangular openings which are sealable by means of a back wall, a door, or an inspection window, and wherein stacking legs are pivotally mounted near the edges of the housing at the corners of said top and bottom walls and said stacking legs are adjustable between a retracted position in which they are substantially flush with said top and bottom walls and an extended position in which they are substantially perpendicular to said top wall and said bottom wall, characterized in that at least said stacking legs mounted at said bottom wall comprise terminal stacking ends, and at least said stacking legs mounted at said top wall form stacking seats in which said terminal stacking ends of said stacking legs in the extended position, are insertable when said stacking legs are in said retracted position.

2. Housing for electrotechnical equipment according to claim 1, characterized in that said side walls, said top wall, and said bottom wall form a one-piece framework.

3. Housing for electrotechnical equipment according to claim 1, characterized in that said side walls are screw fastened to said top wall and said bottom wall and said stacking legs cover the fastening screws.

4. Housing for electrotechnical equipment according to claim 1, characterized in that said stacking legs are pivotally mounted in recesses provided near the edges of the housing where said side walls abut said top wall and said bottom wall.

5. Housing for electrotechnical equipment according to claim 4, characterized in that said stacking legs are pivotally mounted on pivot axes oriented parallel to said edges of the housing.

6. Housing for electrotechnical equipment according to claim 1, characterized in that additional stacking seats are provided at uniform intervals near the edges of the housing wherein said side walls abut said top wall and said bottom wall, said uniform intervals comprising the sum of the width of said stacking legs along the longitudinal direction of said edges and the spacing between adjacent said stacking seats.

7. Housing for electrotechnical equipment according to claim 6, characterized in that said stacking legs are arranged at a uniform interval from said corners of said top and bottom walls and said uniform interval corresponds to said spacing between adjacent said stacking seats.

8. Housing for electrotechnical equipment according to claim 1, characterized in that said stacking seats at said edges of the housing provided in connection with said stacking legs when they are in the retracted position comprise grooves extending from said edges, said grooves having groove bases oriented at an angle of about 135° to the outer surface of adjacent said side walls and the adjacent said top wall or the adjacent said bottom wall, and said grooves additionally comprise transition regions to said groove bases comprising a shoulder oriented perpendicular to said side walls, and said terminal stacking ends of said stacking legs in said extended position have a complementary contour to said groove bases.

9. Housing for electrotechnical equipment according to claim 4, characterized in that each said stacking leg is pivotally mounted in a base housing which is retained and fastened in one of said recesses of the housing.

10. Housing for electrotechnical equipment according to claim 9, characterized in that said base housing has a U-shaped configuration and comprises a base plate and two side arms generally perpendicular to said base plate; said base plate merges into a bearing seat for a bearing block of said stacking leg; said side arms of said base housing are provided with bores for receiving a bearing shaft in the area of said bearing seat; said bearing shaft is retained in a bearing bore provided in said bearing block of said stacking leg; and said base plate of said stacking leg covers said side arms of said base housing when said stacking leg is in said retracted position.

11. Housing for electrotechnical equipment according to claim 10, characterized in that said bearing seat of said base housing is provided with stops, said bearing block of said stacking leg is provided with counterstops, and said stops abut said counterstops when said stacking leg is in said retracted position.

12. Housing for electrotechnical equipment according to claim 11, characterized in that said stacking leg is substantially perpendicular to the outer surface of said top wall and said bottom wall in the extended position.

13. Housing for electrotechnical equipment according to claim 12, characterized in that said stacking leg is generally U-shaped and comprises a support plate and two canted side arms which are connected to said bearing block; the outside of said support plate terminates flush with the outside of said top wall or said bottom wall when said stacking leg is in said retracted position, while said side arms are adjacent said base plate of said base housing; surfaces of said support plate face away from said bearing block and said canted side arms form said terminal stacking end of said stacking leg; and the surface of said support plate which faces said bearing block and which provides said counterstop and said bearing block together with said stop provided on said bearing seat of said base housing form said stacking seat when said stacking leg is in said retracted position.

14. Housing for electrotechnical equipment according to claim 13, characterized in that a support leg having two side arms is pivotally mounted on a pivot axis oriented parallel to said edges of the housing corresponding to the pivot axis of said stacking leg, said support leg is longer than said stacking leg and is adjustable between a flush retracted position and an extended position in which said support leg is at an angle of greater than 90° to the outer surface of said top wall or said bottom wall.

15. Housing for electrotechnical equipment according to claim 14, characterized in that said support leg is mounted on said bearing shaft, said two support leg side arms are arranged between said side arms of said base housing and said side arms of said stacking leg; said side arms of said support leg in said retracted position are adjacent said base plate of said base housing and are connected by a connecting plate in the area outside said support plate of said stacking leg; said support plate of said stacking leg covers said side arms of said support leg and said side warms of said base housing; said connecting plate of said support leg covers said side arms of said base housing; and the edges of said side arms of said stacking leg which face said support plate of said stacking leg, are at an acute angle to said support plate of said stacking leg when said stacking leg and said support leg are in said retracted position, said acute angle opening toward said terminal ends of said stacking leg and said support leg.

16. Housing for electrotechnical equipment according to claim 6, characterized in that additional stacking seats are provided only in said top wall of the housing, and said bottom wall of the housing is provided with four stacking units, each said stacking unit comprising a stacking leg and a support leg.

17. Housing for electrotechnical equipment according to claim 1, characterized in that said top wall of the housing comprises four evenly spaced stacking legs and four stacking seats and said bottom wall of the housing comprises four stacking units, each said stacking unit comprising a stacking leg.

18. Housing for electrotechnical equipment according to claim 1, characterized in that said top wall of the housing comprises four evenly spaced stacking legs and four stacking seats and said bottom wall of the housing comprises four stacking units, each said stacking unit comprising a stacking leg and a support leg.

19. Housing for electrotechnical equipment according to claim 18, characterized in that said top wall and said bottom wall of the housing are provided with recesses for accommodating said stacking legs and support legs, and said recesses on said top wall are sealable by means of cover plates which are provided with said stacking seats.

* * * * *